United States Patent
Zhang et al.

(10) Patent No.: US 7,282,415 B2
(45) Date of Patent: Oct. 16, 2007

(54) METHOD FOR MAKING A SEMICONDUCTOR DEVICE WITH STRAIN ENHANCEMENT

(75) Inventors: Da Zhang, Austin, TX (US); Bich-Yen Nguyen, Austin, TX (US); Voon-Yew Thean, Austin, TX (US); Yasuhito Shiho, Austin, TX (US); Veer Dhandapani, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 175 days.

(21) Appl. No.: 11/092,291

(22) Filed: Mar. 29, 2005

(65) Prior Publication Data

US 2006/0228863 A1 Oct. 12, 2006

(51) Int. Cl.
*H01L 21/336* (2006.01)
(52) U.S. Cl. .............. 438/300; 257/E21.345; 257/E21.336; 257/E21.427; 257/E21.193
(58) Field of Classification Search ............ 438/300; 257/E29.267, E21.131
See application file for complete search history.

(56) References Cited

U.S. PATENT DOCUMENTS

| | | | |
|---|---|---|---|
| 5,650,340 A * | 7/1997 | Burr et al. | 438/286 |
| 5,817,560 A * | 10/1998 | Gardner et al. | 438/301 |
| 5,908,313 A | 6/1999 | Chau et al. | |
| 6,071,783 A * | 6/2000 | Liang et al. | 438/301 |
| 6,162,691 A * | 12/2000 | Huang | 438/300 |
| 6,265,292 B1 * | 7/2001 | Parat et al. | 438/524 |
| 6,331,467 B1 | 12/2001 | Brown et al. | |
| 6,368,926 B1 | 4/2002 | Wu | |
| 6,489,206 B2 * | 12/2002 | Chen et al. | 438/300 |
| 6,503,833 B1 | 1/2003 | Ajmera et al. | |
| 6,605,498 B1 | 8/2003 | Murthy et al. | |
| 6,621,131 B2 | 9/2003 | Murthy et al. | |
| 6,703,648 B1 * | 3/2004 | Xiang et al. | 257/192 |
| 6,800,899 B2 * | 10/2004 | Gonzalez | 257/330 |

(Continued)

OTHER PUBLICATIONS

Gannavaram, Shyam et al.; "Low Temperature (≦800 ° C.) Recessed Junction Selective Silicon-Germanium Source/Drain Technology for sub-70nm CMOS"; IEDM; 2000, pp. 18.3.1-18.3.4; IEEE, USA.

(Continued)

*Primary Examiner*—Walter Lindsay, Jr.
*Assistant Examiner*—Thu-Huong Dinh
(74) *Attorney, Agent, or Firm*—Robert L. King; Daniel D. Hill

(57) ABSTRACT

A semiconductor device with strain enhancement is formed by providing a semiconductor substrate and an overlying control electrode having a sidewall. An insulating layer is formed adjacent the sidewall of the control electrode. The semiconductor substrate and the control electrode are implanted to form first and second doped current electrode regions, a portion of each of the first and second doped current electrode regions being driven to underlie both the insulating layer and the control electrode in a channel region of the semiconductor device. The first and second doped current electrode regions are removed from the semiconductor substrate except for underneath the control electrode and the insulating layer to respectively form first and second trenches. An insitu doped material containing a different lattice constant relative to the semiconductor substrate is formed within the first and second trenches to function as first and second current electrodes of the semiconductor device.

15 Claims, 3 Drawing Sheets

U.S. PATENT DOCUMENTS

| | | |
|---|---|---|
| 6,815,310 B2 | 11/2004 | Roberds et al. |
| 6,821,856 B2 | 11/2004 | Takagi |
| 6,881,635 B1 | 4/2005 | Chidambarrao et al. |
| 6,921,913 B2 | 7/2005 | Yeo et al. |
| 6,946,371 B2 * | 9/2005 | Langdo et al. ............... 438/481 |
| 6,949,420 B1 | 9/2005 | Yamashita |
| 6,960,781 B2 * | 11/2005 | Currie et al. ................. 257/19 |
| 6,989,570 B2 | 1/2006 | Skotnicki et al. |
| 7,009,226 B1 * | 3/2006 | Sun ............................ 257/192 |
| 7,060,585 B1 * | 6/2006 | Cohen et al. ................ 438/355 |
| 7,067,379 B2 * | 6/2006 | Wen et al. ................... 438/300 |
| 7,118,952 B2 * | 10/2006 | Chen et al. .................. 438/199 |
| 7,122,449 B2 * | 10/2006 | Langdo et al. ............... 438/481 |
| 7,125,774 B2 * | 10/2006 | Kim et al. ................... 438/270 |
| 7,157,779 B2 * | 1/2007 | Nishibe et al. .............. 257/408 |
| 2004/0045499 A1 * | 3/2004 | Langdo et al. ................. 117/84 |
| 2004/0188760 A1 | 9/2004 | Sckotnicki et al. |
| 2006/0030093 A1 * | 2/2006 | Zhang et al. ................ 438/197 |

OTHER PUBLICATIONS

Chidambaram, P.R.; "35% Drive Current Improvement from Recessed-SiGe Drain Extensions on 37nm Gate Length PMOS"; Digest of Technical Papers, Symposium on VLSI Technology; 2004; pp. 48-49; IEEE; USA.

* cited by examiner

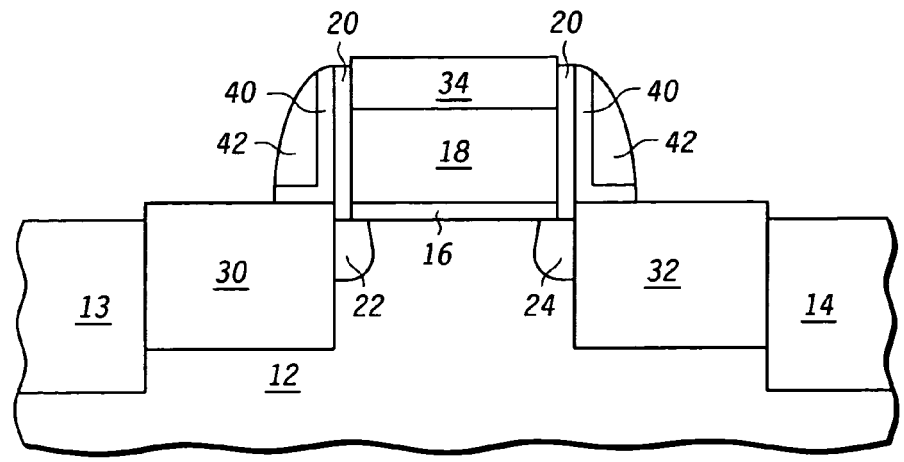
FIG. 7
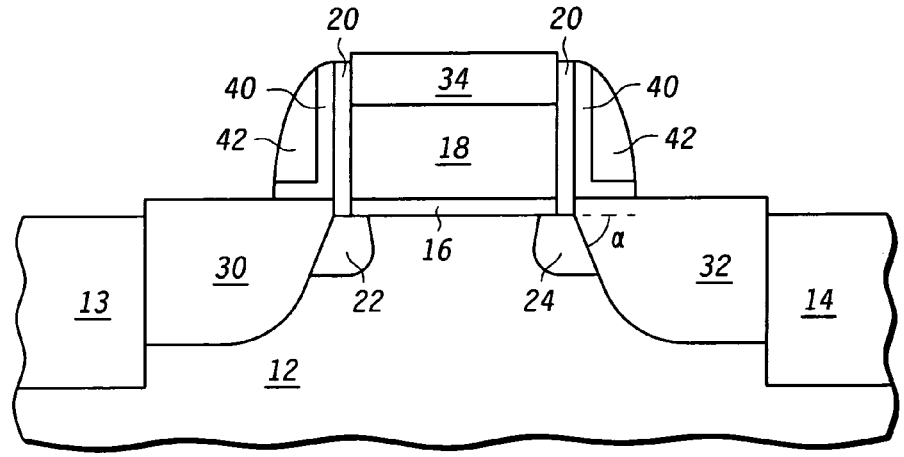
FIG. 8
| SiGe (25% Ge) | STRESS ON CHANNEL | PERCENTAGE OF MAXIMUM STRAIN | CHANNEL CARRIER MOBILITY ENHANCEMENT ACHIEVED |
|---|---|---|---|
| SiGe DEPOSITION FOLLOWED BY AN IMPLANT | $150 \times 10^6$ Pa | 30% | 10.5% |
| INITIAL IMPLANT, FOLLOWED BY PARTIAL REMOVAL THEREOF AND INSITU DOPED SiGe DEPOSITION | $500 \times 10^6$ Pa | 95% | 35% |
FIG. 9

METHOD FOR MAKING A SEMICONDUCTOR DEVICE WITH STRAIN ENHANCEMENT

CROSS REFERENCE TO RELATED APPLICATION

This application is related to: U.S. patent application Ser. No. 10/913,099, entitled "Strained Semiconductor Devices And Method For Forming At Least A Portion Thereof" filed Aug. 6, 2004, and assigned to the assignee hereof, abandoned as of Mar. 22, 2007.

FIELD OF THE INVENTION

This invention relates generally to semiconductor devices, and more specifically, to semiconductor devices with strain enhancement and methods of formation thereof.

BACKGROUND OF THE INVENTION

Strained channel is promising for promoting MOSFET transistor performance by enhancing carrier mobility. Specifically, PMOS prefers compressive strain and NMOS prefers tensile strain. In a conventional planar process for making strained channel transistors, a strained layer is formed as the transistor channel prior to transistor gate dielectric formation. The property of the strained channel is however degraded by subsequent processing. For example, the high temperature gate oxidation process induces species diffusion and strain relaxation. Additionally, for a strained material different from silicon, a silicon cap on the top is typically required due to the general incompatibility of the strained layer and a gate dielectric. The silicon cap layer degrades the efficiency of the strained layer as the carrier conducting layer.

A conventional method of inducing a strained channel transistor after transistor gate stack formation is to etch the deep source/drain regions of a transistor and then embed a stressor material in the recessed areas where the deep source/drain regions were. This etch and refill method typically occurs after the formation of offset spacers. However, known methods that embed a stressor material in the deep source/drain generally fail to achieve a transistor having high strain with permissible defectivity control. The inadequacies are due to the amount of separation that exists from the stressor material to the channel region due in part to the presence of the offset spacers. However, if the stressor material is increased in size (i.e. depth) to enhance the amount of stress, the increased amount of stressor material functions to increase defectivity of the stressor material which reduces the amount of the stress the stressor material provides and increases the amount of transistor current leakage.

In another method, a stressor material is applied in the source/drain extension region after the formation of a gate electrode and a gate spacer. Afterwards, source/drain dopant implantation is performed and followed by an anneal. However, this implantation relaxes the deposited stressor material and thereby degrades the amount of strain that the stressor material applies on the channel. Further, the dopant profile of the source/drain extension and the source/drain is not abrupt due to the anneal.

In yet another method, the source/drain extension region of a transistor must be recessed and filled with insitu doped SiGe or SiC separately with deep source/drain recess in order to maintain the shallow extension for controlling the short channel effect.

BRIEF DESCRIPTION OF THE DRAWINGS

The present invention is illustrated by way of example and is not limited by the accompanying figures, in which like references indicate similar elements.

FIGS. 1-8 illustrate in cross-sectional form methods for making a semiconductor device in accordance with the present invention; and FIG. 9 illustrates in table form characteristics of a semiconductor device formed in accordance with the present invention as compared with a conventional device.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
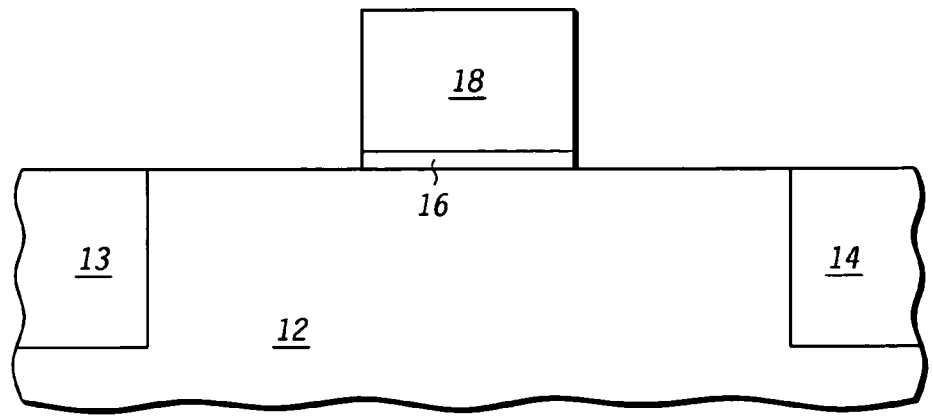

FIG. 1 illustrates a cross-sectional view of a semiconductor device 10 wherein a semiconductor substrate 12 is provided. The semiconductor substrate 12 may be of various semiconductor materials such as single crystal silicon, gallium arsenide and other materials. Within semiconductor substrate 12 is an isolation trench 13 and an isolation trench 14 for providing electrical isolation within the semiconductor substrate 12. Overlying the semiconductor substrate 12 is an insulating layer 16. In one form the insulating layer 16 is an oxide such as silicon dioxide. Other dielectrics such as silicon oxynitride and high k dielectrics may be used. Overlying the insulating layer 16 is a control electrode or a gate 18. Both the gate 18 and the insulating layer 16 have been patterned in a conventional manner to overlie only a desired portion of the semiconductor substrate 12. The gate 18 is made of a conductive material such as polysilicon or metal, for example. Insulating layer 16 will therefore function as a gate oxide layer.

Figure 2:
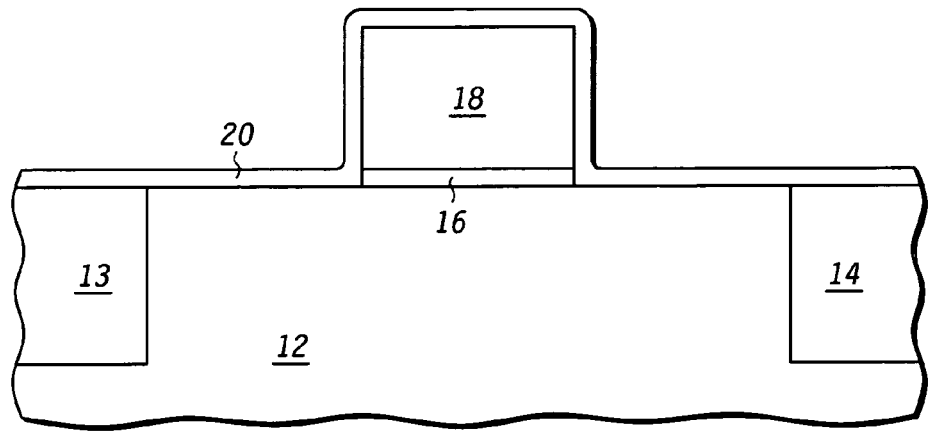

FIG. 2 illustrates a cross-sectional view of further processing of semiconductor device 10. A blanket deposition of an insulating layer 20 is then performed. The insulating layer 20 is conformally deposited and therefore evenly forms on the sides of gate 18 as well as on exposed horizontal surfaces. In one form insulating layer 20 is made of silicon nitride. However, other dielectric materials may be used.

Figure 3:
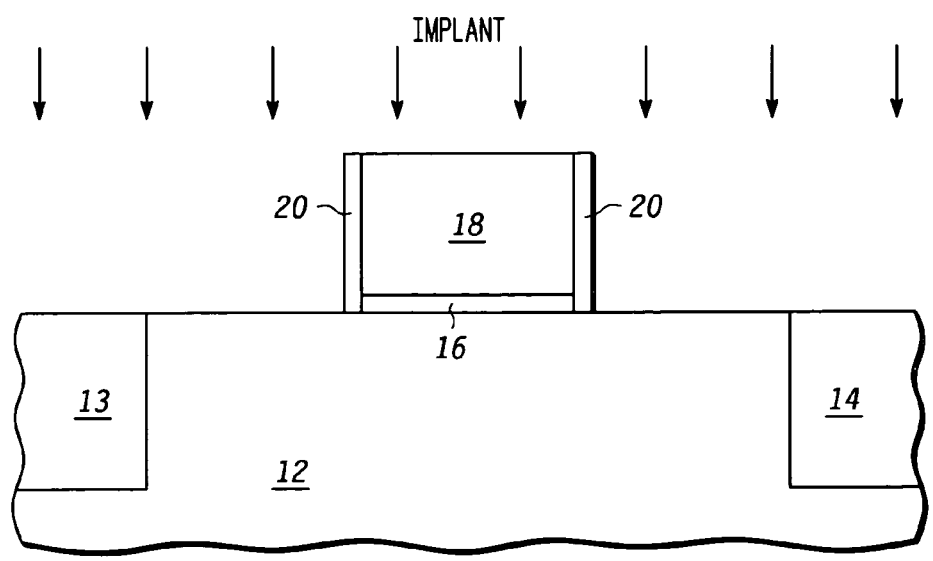

FIG. 3 illustrates in cross-sectional form further processing of semiconductor device 10. An anisotropic etch of insulating layer 20 is performed so that the insulating layer 20 is removed from all exposed horizontal surfaces but not at the exposed vertical surfaces. Therefore, insulating layer 20 remains along a continuous sidewall of the gate 18 and insulating layer 16. It should be understood that two portions, a left-sided and a right-sided portion of the continuous sidewall are illustrated in the cross-sectional view. The etch will remove a small portion (not shown) of the insulating layer 20 from the top of the sidewall but the effect is inconsequential. The etch chemistry is conventional and will therefore not be further discussed. At this point in the processing a conventional extension ion implant with either P-conductivity or N-conductivity dopant material is performed. Optionally a halo implantation (not shown) is done prior to the extension implantation. A halo implantation involves angled implanting in which ions are implant from two or more angles. The halo implantation may be used to form a symmetric device having symmetric source/drain implantation or to form an asymmetric device having asymmetric source/drain implantation. For a P-channel semiconductor device, the halo implant will have an N-type conductivity. Similarly, for an N-channel semiconductor device, the halo implant will have a P-type conductivity. The optional halo implant controls the short channel behavior of the semiconductor device 10 by compensating the extension dopant migration toward the channel region from the source and the drain.

Figure 4:
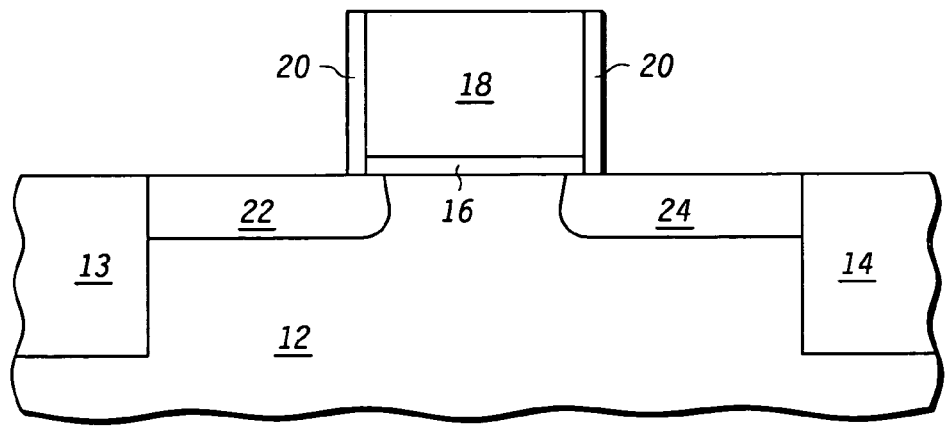

FIG. 4 illustrates in cross-sectional form further processing of semiconductor device 10 wherein a source 22 and a drain 24 have been formed as a result of the ion implantation. An anneal is performed to drive the implanted dopants under a portion of the gate 18 within the channel region. The temperature of the anneal is typically in a range of nine hundred degrees Celsius to around eleven hundred degrees Celsius. The temperature of the anneal and the amount of time of the anneal will determine the amount that the implants are driven under the gate 18. Therefore the length of the channel separation between source 22 and drain 24 may be controlled to avoid any short channel effects.

Figure 5:
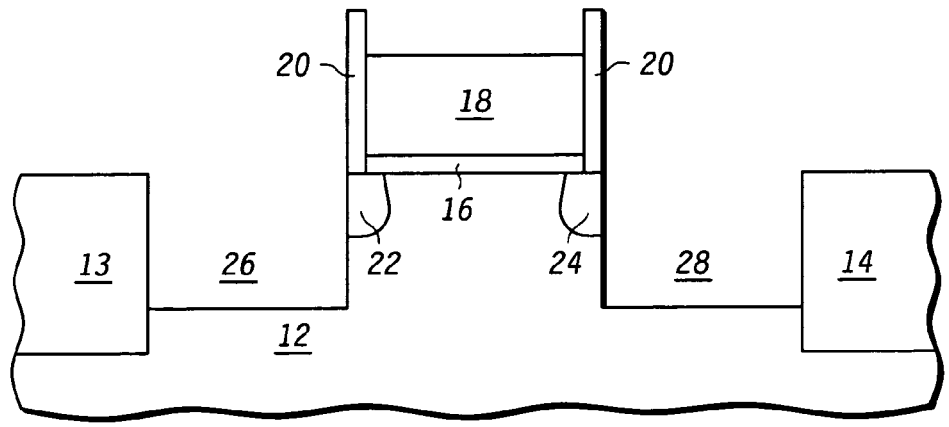

FIG. 5 illustrates in cross-sectional form further processing of semiconductor device 10 wherein a selective etch is performed to remove exposed portions of the source 22 and drain 24. A conventional dry etch is used. In one form the dry etch is anisotropic. The etching results in a recessed region 26 where source 22 was previously present and a recessed region 28 wherein drain 24 was previously present. It should be noted also that some etching of the gate 18 occurs but that the amount of etching may typically be controlled through etch chemistry to avoid significant erosion of the gate 18. In another form a protecting cap layer (not shown) may first be deposited overlying gate 18 prior to the etching. With the presence of a cap layer, no etching of gate 18 would occur. However, a prior deposition step and a subsequent removal step would be required. It should be noted that the depth of the recessed regions 26 and 28 is greater than the depth of source 22 and drain 24, respectively. The depth of the recessions may vary, but should be large enough to totally remove the source 22 and the drain 24. In one form, the depth of the recessed regions 26 and 28 is within a range of approximately 300 Angstroms to 500 Angstroms. It should be further noted that an important aspect of the etching is that a portion of source 22 and a portion of drain 24 remain within semiconductor device 10. In particular, a portion of source 22 underlying gate 18 and at an edge of the channel region remains. Similarly, a portion of drain 24 underlying gate 18 and at an opposite edge of the channel region remains. As a result of the presence of these smaller portions of source 22 and drain 24, the source-to-drain resistance of semiconductor device 10 is reduced. Therefore, the drive current of the resulting semiconductor device 10 is enhanced.

Figure 6:
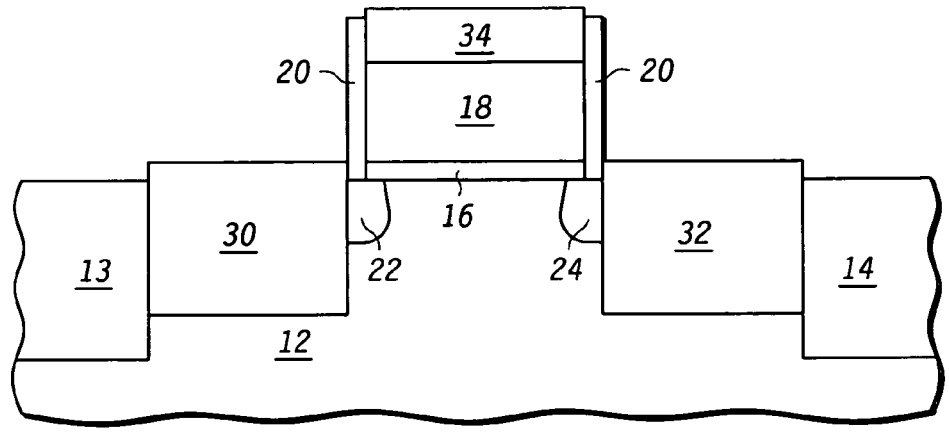

Illustrated in FIG. 6 in cross-sectional form is further processing of semiconductor device 10. The recessed regions 26 and 28 are filled by a deposition with an epitaxial stressor material having insitu doping. In one form the epitaxial stressor material for a P-channel transistor is silicon germanium having boron as the insitu dopant. Similarly, in one form the expitaxial stressor material for an N-channel transistor is silicon carbon having phosphorous as the insitu dopant. It can be seen from FIG. 6 and the following figures that the resulting dopant profile is very abrupt which is desired. The more abrupt the doping profile is, the better the device electrical performance becomes. The use of an insitu doping process permits this sharp doping profile and the obviation of a further anneal avoids further degradation of the profile. A source region 30 and a drain region 32 are therefore formed. A fill region 34 is formed overlying gate 18 in the void created from the previous etching. The source region 30 and drain region 32 are slightly elevated and have an upper surface that is planar with or higher than an upper surface of the insulating layer 16. This elevation provides a margin for error to ensure that the upper surface of source region 30 and drain region 32 is at least above the lower surface of insulating layer 16 which functions as the gate dielectric for gate 18. The deposition step in FIG. 6 is selective and therefore none of the epitaxial stressor material grows on the side surfaces of insulating layer 20 or the exposed top surfaces of isolation trench 13 and isolation trench 14. It can be readily seen from FIG. 6 that the source region 30 and the drain region 32 that contain stressor material function to provide a significant amount of strain to the channel region due to the proximity of these regions to the channel. Additionally, without affecting the amount of strain, the separation distance between the source and the drain within the channel is independently controlled, largely as a function of an earlier anneal step. The resulting channel region has enhanced carrier mobility as a result of the increased channel strain. Fill region 34 and gate 18 function together as a single conductive control electrode or gate for the semiconductor device 10. The material that is used for both fill region 34 and gate 18 is a conductor, but the two regions do not necessarily have to be of the same material.

Illustrated in FIG. 7 is further processing of semiconductor device 10 wherein a completed functional transistor is formed. A sidewall liner 40 and a sidewall spacer 42 are formed along all exposed side surfaces of the insulating layer 20 and over a portion of the source region 30 and the drain region 32. The sidewall liner 40 and the sidewall spacer 42 are formed by conventional deposition and etch techniques. A primary purpose for the sidewall liner 40 and sidewall spacer 42 is to provide some offset from the gate stack for a silicided contact to each of the source region 30 and the drain region 32. The sidewall liner 40 functions with the sidewall spacer 42 to enhance the etching of the material used for these regions and permit accurate removal without degrading the upper surface of source region 30 and drain region 32. In the illustrated form the sidewall liner 40 functions as an etch stop layer for the etching of sidewall spacer 42 material. The sidewall liner 40 may then be readily removed with a selective wet etching processing. However, it should be understood that a single material may be used to form a sidewall spacer. The sidewall spacer 42 is used to permit the formation of conductive contacts on the exposed upper surface of source region 30, gate 34 and drain region 32 without directly electrically short circuiting these three elements.

Illustrated in FIG. 8 is further processing of semiconductor device 10 wherein an alternative processing method is implemented. Assume again the structure of semiconductor device 10 in FIG. 5. Instead of processing semiconductor device 10 as illustrated in FIGS. 6 and 7, the semiconductor device 10 may be processed as illustrated in FIG. 8. In particular, a hydrogen anneal is performed when recessed regions 26 and 28 exist so that the profile of the semiconductor substrate 12 defining the recessed regions 26 and 28 is altered. Instead of being a substantially vertical and horizontal edge profile, the anneal that is performed in the presence of hydrogen modifies the semiconductor substrate 12 by extending the silicon within the semiconductor substrate 12 and thereby making the contour of the recessed regions 26 and 28 rounded or curvilinear. The slope of the edge of drain region 32 measured with respect to a horizontal reference line is represented by the angle $\alpha$. The value of $\alpha$ may vary but in one form is in a range of twenty degrees to seventy degrees. With the curvilinear profile, the amount of encroachment of the channel region by each of the source and the drain is reduced. This feature is significant as semiconductor critical dimensions continue to shrink because electrical leakage from the channel resulting from encroachment of the source and the drain becomes problematic. As a result of the hydrogen anneal, the source and drains remain adjacent to the gate at the surface but are extended further away from the channel as a function of the distance into the semiconductor substrate 12. A typical anneal temperature is, for example only, within a range of about 750 to 950 degrees Celsius for an amount of time of approximately one minute. However, if one processing parameter is varied, the other parameters may also differ. Either $H_2$, hydrogen-containing agents, such as silane or germane, or a combination thereof may be used during the anneal.

Illustrated in FIG. 9 is a table for illustrating benefits achieved regarding improved channel strain by using the methods described above. In particular, assume that the source region 30 and the drain region 32 have silicon germanium (SiGe) stressor material content in the form of approximately twenty-five percent germanium (Ge) and seventy-five percent silicon (Si). Silicon germanium is known to have the benefit of inducing strain when used in a source or drain. Comparisons will be made in FIG. 8 regarding the stress on a channel, the percentage actually achieved of a maximum one hundred percent of strain that is possible, and the channel carrier mobility enhancement that is achieved. For these three categories, a comparison between two significantly different methods is made. In a first method a silicon germanium deposition of stressor material is followed by an ion implant of the stressor material to create source/drain extensions. In a second method, an initial ion implant occurs followed by the partial removal of the ion implanted regions and the deposition of insitu doped silicon germanium in the removed material areas. The second method corresponds to the methods described above in connection with FIGS. 1-8. As illustrated in FIG. 8, the stress on the channel when an implant is performed after the deposition of silicon germanium is $150 \times 10^6$ Pascals (Pa). In contrast, when the implant is initially performed and the silicon germanium is deposited after partial removal thereof, the stress on the channel increases significantly to $500 \times 10^6$ Pascals. When an implant is performed after the deposition of silicon germanium, the realized percentage of the maximum strain that is achievable is thirty percent (30%). In contrast, when the implant is initially performed and the silicon germanium is deposited after partial removal thereof, the realized percentage of the maximum strain that is achievable is ninety-five percent (95%). When an implant is performed after the deposition of silicon germanium, the channel carrier mobility enhancement that is achieved is 10.5 percent. In contrast, when the implant is initially performed and the silicon germanium is deposited after partial removal thereof, the channel carrier mobility enhancement that is achieved is 35 percent. Therefore, it can be readily seen that a significant performance improvement in the amount of realized stress is achieved by using the methods described herein.

By now it should be appreciated that there has been provided a method for providing strain in a channel of a transistor. An initial extension implant is performed. A portion of the initially implanted area is removed, leaving a portion that is immediately adjacent opposite sides or edges of the channel. The remaining doped portion provides good overlapping in the gate-to-source and gate-to-drain regions to minimize the external resistance of the semiconductor device 10. Epitaxial refilling into the recessed area of a stressor material with insitu doping is performed. The stressor material provides high strain in the channel region.

In one form there is herein provided a method for making a semiconductor device. A semiconductor substrate is provided. A control electrode having a sidewall and overlying the semiconductor substrate is formed. An insulating layer adjacent the sidewall of the control electrode is formed. The semiconductor substrate and the control electrode are implanted to form first and second doped current electrode regions, a portion of each of the first and second doped current electrode regions being driven to underlie both the insulating layer and the control electrode in a channel region of the semiconductor device. The first and second doped current electrode regions are removed from the semiconductor substrate except for underneath both the control electrode and the insulating layer to respectively form first and second trenches. An insitu doped material containing a different lattice constant relative to the semiconductor substrate is formed within the first and second trenches to fill the first and second trenches and function as first and second current electrodes of the semiconductor device, the first and second current electrodes applying a stress on the channel region. In another form a hydrogen-containing gas is flowed over the semiconductor device at a temperature of at least six hundred degrees Celsius prior to forming the insitu doped material containing a different lattice constant relative to the semiconductor substrate, the hydrogen-containing gas modifying a slope of an edge of the first and second trenches to position the first and second trenches further away from the channel region. In another form the slope of the edge of the first and second trenches is modified by an angle measured relative to a horizontal reference that is within a range of twenty to seventy degrees. In yet another form the insitu doped material containing a different lattice constant relative to the semiconductor substrate is formed by forming silicon germanium within the first and second trenches when the semiconductor device comprises a P conductivity channel region and forming silicon carbon within the first and second trenches when the semiconductor device comprises an N conductivity channel region. In yet another form the insulating layer adjacent the sidewall of the control electrode is formed by forming either silicon nitride or a composite material of silicon dioxide and silicon nitride. In yet another form a portion of each of the first and second doped current electrode regions is driven to underlie both the insulating layer and the control electrode in the channel region by annealing the semiconductor device at a temperature in a range of nine hundred degrees Celsius to eleven hundred degrees Celsius. In yet another form a portion of the control electrode is removed when removing the first and second doped current electrode regions and all of the removed portion is replaced with the insitu doped material containing a different lattice constant relative to the semiconductor substrate.

In yet another form there is provided a method in which a semiconductor substrate is provided. A gate is formed having a sidewall and overlying the semiconductor substrate. A gate sidewall insulator adjacent the sidewall of the gate is formed. The semiconductor substrate and the gate are implanted to form first and second doped current electrode regions. The semiconductor substrate is annealed to move a portion of each of the first and second doped current electrode regions under the gate sidewall insulator and a portion of the gate in a channel region. The first and second doped current electrode regions are removed from the semiconductor substrate except for underneath the portion of the gate and the gate sidewall insulator to respectively form first and second trenches. An insitu doped stressor material is formed within the first and second trenches to fill the first and second trenches and function as first and second current electrodes, the first and second current electrode regions applying a stress on the channel region. In another form a hydrogen-containing gas is flowed over the semiconductor substrate at a temperature of at least six hundred degrees Celsius prior to forming the insitu doped stressor material within the first and second trenches, the hydrogen-containing gas modifying a slope of an edge of the first and second trenches to position the first and second trenches further away from the channel region. In yet another form the implanting further comprises performing both a halo implant and an extension implant to form the first and second doped current electrode regions. In one form the halo implant is used to form asymmetric implantation of the first and second doped current electrode regions. In another form a portion of the gate is removed when removing the first and second doped current electrode regions and subsequently replacing all removed portion with the insitu doped stressor material. In yet another form a slope of a side of the first and second trenches is modified by an angle measured relative to a horizontal reference that is within a range of twenty to seventy degrees. In a further form a first angle is used for the slope when the first and second trenches are P-conductivity type and a second angle is used for the slope when the first and second trenches are N-conductivity type, the first angle differing from the second angle. The variation depends upon short channel effect requirements.

In yet another form there is provided a method for making a transistor with strain enhancement comprising sequential steps. A semiconductor substrate is provided. A gate having a sidewall and overlying the semiconductor substrate is formed. An insulating layer adjacent the sidewall of the gate is formed. The semiconductor substrate and the gate are implanted to form a source and a drain, a portion of each of the source and the drain being driven to underlie both the insulating layer and the gate in a channel region of the transistor underlying the gate. A portion of the source and drain is removed from the semiconductor substrate except for underneath both the gate and the insulating layer to respectively form first and second trenches. Insitu doped silicon germanium is formed within the first and second trenches to fill the first and second trenches and function as the source and the drain of the transistor, the source and the drain applying a stress on the channel region. In yet another form a hydrogen-containing gas is flowed over the transistor at a temperature of at least six hundred degrees Celsius after removing the portion of the source and drain but prior to forming insitu doped silicon germanium, the hydrogen-containing gas modifying a slope of an edge of the first and second trenches to position the first and second trenches further away from the channel region. In yet another form when flowing the hydrogen-containing gas, the slope of the edge of the first and second trenches is modified by an angle measured relative to a horizontal reference that is within a range of twenty to seventy degrees. A portion of the gate is removed when removing the source and drain and all of the removed portion is replaced with the insitu doped silicon germanium. In yet another form both a halo implant and an extension implant are made to form the source and the drain. In yet another form the halo implant is used to form asymmetric implantation of the source and the drain.

In the foregoing specification, the invention has been described with reference to specific embodiments. However, one of ordinary skill in the art appreciates that various modifications and changes can be made without departing from the scope of the present invention as set forth in the claims below. For example, the stress enhancement method may be used with a variety of stress-enhancing materials. The present invention is not limited to the formation of transistors. It should be well understood that other devices, such as diodes and optical devices may benefit from the methods described herein. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language).

The invention claimed is:

1. A method for making a semiconductor device comprising:

providing a semiconductor substrate;

forming a control electrode having a sidewall and overlying the semiconductor substrate;

forming an insulating layer adjacent the sidewall of the control electrode;

implanting the semiconductor substrate and the control electrode to form first and second doped current electrode regions and performing a halo implant to form asymmetric implantation of the first and second doped current electrode regions, a portion of each of the first and second doped current electrode regions being driven to underlie both the insulating layer and the control electrode in a channel region of the semiconductor device;

removing the first and second doped current electrode regions from the semiconductor substrate except for underneath both the control electrode and the insulating layer to respectively form first and second trenches and removing a portion of the control electrode;

performing an anneal in the presence of hydrogen at a temperature of at least six hundred degrees Celsius to modify a contour of the first and second trenches to be curvilinear to extend further from a channel of the semiconductor device as a function of distance into the semiconductor substrate; and forming an insitu doped material containing a different lattice constant relative to the semiconductor substrate within the portion of the control electrode and within the first and second trenches to fill the first and second trenches and function as first and second current electrodes of the semiconductor device, the first and second current electrodes applying a stress on the channel region.

2. The method of claim 1 further comprising:
modifying a slope of an edge of the first and second trenches by an angle measured relative to a horizontal reference that is within a range of twenty to seventy degrees.

3. The method of claim 1 further comprising:
forming the insitu doped material containing a different lattice constant relative to the semiconductor substrate by forming silicon germanium within the first and second trenches when the semiconductor device comprises a P conductivity channel region and forming silicon carbon within the first and second trenches when the semiconductor device comprises an N conductivity channel region.

4. The method of claim 1 further comprising:
forming the insulating layer adjacent the sidewall of the control electrode by forming either silicon nitride, carbon doped oxide or a composite material of silicon dioxide, silicon nitride and carbon doped oxide.

5. The method of claim 1 further comprising:
driving a portion of each of the first and second doped current electrode regions to underlie both the insulating layer and the control electrode in the channel region by annealing the semiconductor device at a temperature in a range of nine hundred degrees Celsius to eleven hundred degrees Celsius.

6. A method comprising:
providing a semiconductor substrate;
forming a gate having a sidewall and overlying the semiconductor substrate;
forming a gate sidewall insulator adjacent the sidewall of the gate;
implanting the semiconductor substrate and the gate with an extension implant to form first and second doped current electrode regions and performing a halo implant to form asymmetric implantation of the first and second doped current electrode regions;
annealing the semiconductor substrate to move a portion of each of the first and second doped current electrode regions under the gate sidewall insulator and a portion of the gate in a channel region;
removing the first and second doped current electrode regions from the semiconductor substrate except for underneath the portion of the gate and the gate sidewall insulator to respectively form first and second trenches; and
forming an insitu doped stressor material within the first and second trenches to fill the first and second trenches and function as first and second current electrodes, the first and second current electrode regions applying a stress on the channel region.

7. The method of claim 6 further comprising:
flowing a hydrogen-containing gas over the semiconductor substrate at a temperature of at least six hundred degrees Celsius prior to forming the insitu doped stressor material within the first and second trenches, the hydrogen-containing gas modifying a slope of an edge of the first and second trenches to position the first and second trenches further away from the channel region.

8. The method of claim 6 further comprising:
removing a portion of the gate when removing the first and second doped current electrode regions and subsequently replacing all removed portion with the insitu doped stressor material.

9. The method of claim 6 further comprising:
modifying a slope of a side of the first and second trenches by an angle measured relative to a horizontal reference that is within a range of twenty to seventy degrees.

10. The method of claim 9 further comprising:
using a first angle for the slope when the first and second trenches are P-conductivity type and using a second angle for the slope when the first and second trenches are N-conductivity type, the first angle differing from the second angle.

11. A method for making a transistor with strain enhancement, comprising the sequential steps of:
providing a semiconductor substrate;
forming a gate having a sidewall and overlying the semiconductor substrate;
forming an insulating layer adjacent the sidewall of the gate;
implanting the semiconductor substrate and the gate to form a source and a drain, a portion of each of the source and the drain being driven to underlie both the insulating layer and the gate in a channel region of the transistor underlying the gate;
removing a portion of the source and drain from the semiconductor substrate except for underneath both the gate and the insulating layer to respectively form first and second trenches
forming insitu doped silicon germanium within the first and second trenches to fill the first and second trenches and function as the source and the drain of the transistor, the source and the drain applying a stress on the channel region; and
flowing a hydrogen-containing gas over the transistor at a temperature of at least seven hundred degrees Celsius after removing the portion of the source and drain but prior to forming insitu doped silicon germanium, the hydrogen-containing gas modifying a slope of an edge of the first and second trenches to position the first and second trenches further away from the channel region.

12. The method of claim 11 further comprising:
when flowing the hydrogen-containing gas, modifying the slope of the edge of the first and second trenches by an angle measured relative to a horizontal reference that is within a range of twenty to seventy degrees.

13. The method of claim 11 further comprising:
removing a portion of the gate when removing the source and drain and replacing all removed portion with the insitu doped silicon germanium.

14. The method of claim 11 wherein the step of implanting further comprises:
performing both a halo implant and an extension implant to form the source and the drain.

15. The method of claim 14 further comprising:
using the halo implant to form asymmetric implantation of the source and the drain.

* * * * *